United States Patent
Kim et al.

(10) Patent No.: US 12,251,730 B2
(45) Date of Patent: *Mar. 18, 2025

(54) FLEXIBLE TACTILE ACTUATOR

(71) Applicant: CK MATERIALS LAB CO., LTD., Seoul (KR)

(72) Inventors: Hyeong Jun Kim, Seoul (KR); Myung Sun Park, Seoul (KR); Jong Hun Lee, Seoul (KR); Ji Goo Kang, Seoul (KR); Nam Seok Kim, Seoul (KR)

(73) Assignee: CK MATERIALS LAB CO., LTD., Seoul (KR)

( * ) Notice: Subject to any disclaimer, the term of this patent is extended or adjusted under 35 U.S.C. 154(b) by 212 days.

This patent is subject to a terminal disclaimer.

(21) Appl. No.: 17/968,969

(22) Filed: Oct. 19, 2022

(65) Prior Publication Data

US 2023/0049042 A1  Feb. 16, 2023

Related U.S. Application Data

(62) Division of application No. 15/763,206, filed as application No. PCT/KR2017/011485 on Oct. 18, 2017, now Pat. No. 11,504,743.

(30) Foreign Application Priority Data

Nov. 8, 2016 (KR) .......... 10-2016-0148337
Apr. 7, 2017 (KR) .......... 10-2017-0045359

(51) Int. Cl.
*B06B 1/08* (2006.01)
*G08B 6/00* (2006.01)
(Continued)

(52) U.S. Cl.
CPC .......... *B06B 1/08* (2013.01); *G08B 6/00* (2013.01); *G08B 7/00* (2013.01); *H10N 35/00* (2023.02); *H10N 35/01* (2023.02); *H10N 35/85* (2023.02)

(58) Field of Classification Search
CPC ... B06B 1/08; G08B 6/00; G08B 7/00; H10N 35/00; H10N 35/01; H10N 35/85; H10N 30/20; H10N 30/85; G06F 3/016
See application file for complete search history.

(56) References Cited

U.S. PATENT DOCUMENTS 8,378,796 B2   2/2013   Hwang
9,137,608 B2   9/2015   Takahashi et al.
(Continued)

FOREIGN PATENT DOCUMENTS

JP   2006004753 A   1/2006
JP   2008195826 A   8/2008
(Continued)

OTHER PUBLICATIONS

Kikuchi et al. "Basic Study on Walking Guidance System with Magnetic-field Sensitive Gel" 2010.
(Continued)

*Primary Examiner* — Thomas Truong
(74) *Attorney, Agent, or Firm* — Jae Youn Kim; NKL Law

(57) ABSTRACT

Disclosed is a flexible tactile actuator including a tactile transmitter configured to be flexible and including magnetic particles capable of being polarized in response to an external magnetic field and a matrix layer including the magnetic particles, a magnetic field generator disposed below the tactile transmitter and configured to generate a magnetic field in the tactile transmitter, and an elastic member provided in a shape of a film, having at least a (Continued)

First shape

Second shape portion in surface contact with the magnetic field generator, and attached to be in surface contact with one of a top surface and a bottom surface of the tactile transmitter.

20 Claims, 15 Drawing Sheets

(51) Int. Cl.
*G08B 7/00* (2006.01)
*H10N 35/00* (2023.01)
*H10N 35/01* (2023.01)
*H10N 35/85* (2023.01)

(56) References Cited

U.S. PATENT DOCUMENTS

| | | |
|---|---|---|
| 10,204,494 B2 | 2/2019 | Do |
| 10,517,791 B2 | 12/2019 | Ward |
| 2004/0086659 A1 | 5/2004 | Anjanappa |
| 2011/0173970 A1 | 7/2011 | Torres-Jara |
| 2013/0335354 A1 | 12/2013 | Zellers |
| 2014/0081879 A1 | 3/2014 | Olson |
| 2014/0145555 A1 | 5/2014 | Kurachi |
| 2016/0239086 A1* | 8/2016 | Do ............................ H01F 7/126 |
| 2019/0094971 A1* | 3/2019 | Kim ...................... G06F 3/0338 |

FOREIGN PATENT DOCUMENTS

| | | |
|---|---|---|
| JP | 2012027765 | 2/2012 |
| JP | 2015027661 | 2/2015 |
| JP | 2015115078 | 6/2015 |
| JP | 2016029563 | 3/2016 |
| JP | 2016173774 | 9/2016 |
| KR | 10-2011-0029449 | 3/2011 |
| KR | 10-1075263 | 10/2011 |
| KR | 1020130086235 | 7/2013 |
| KR | 10-1461274 | 11/2014 |
| KR | 10-1554289 | 9/2015 |
| KR | 20160021160 | 2/2016 |
| KR | 10-1626375 | 6/2016 |
| WO | 2011074579 A1 | 6/2011 |
| WO | 2012/067070 | 5/2012 |
| WO | 2016052803 | 4/2016 |

OTHER PUBLICATIONS

Masuda et al. "Study on Magnetic-field Sensitive Elastomer Device (MSED)" 2011.

International Search Report issued in PCT/KR2017/011485 Jan. 29, 2018, 3 pages.

Written Opinion issued in PCT/KR2017/011485 Jan. 29, 2018, 4 pages.

* cited by examiner

FIG. 7
10
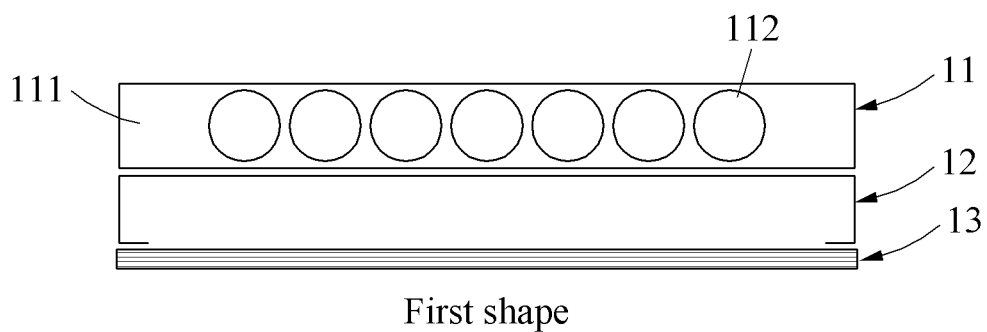
First shape
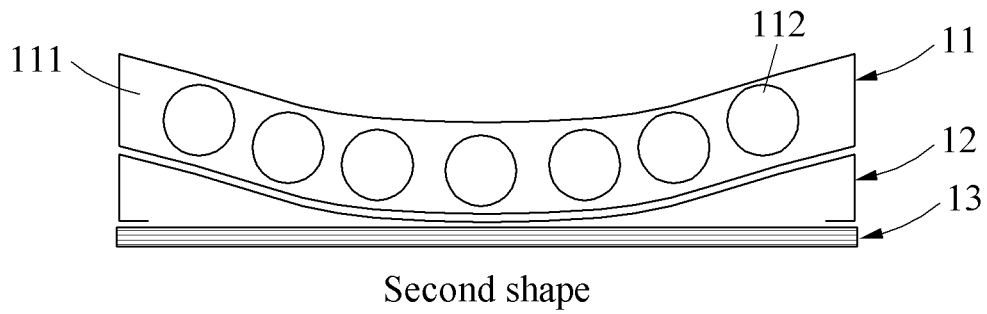
Second shape

FIG. 8
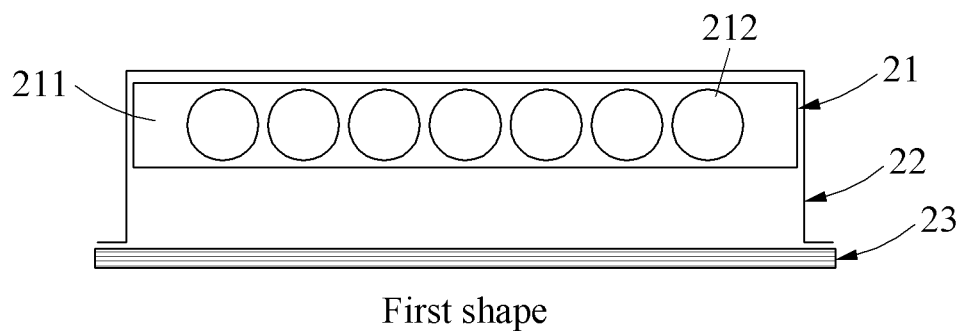
First shape
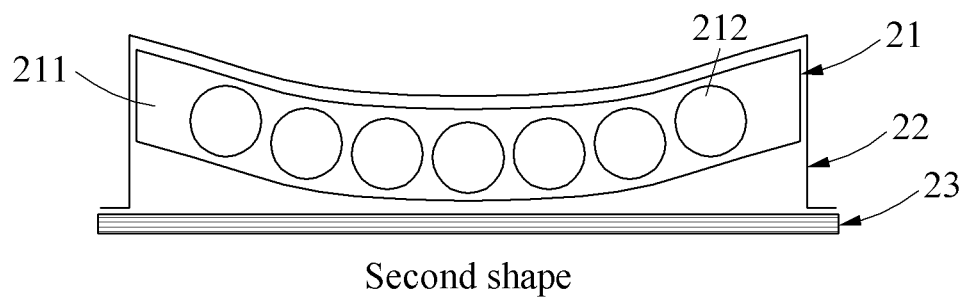
Second shape

First shape

Second shape

FLEXIBLE TACTILE ACTUATOR

TECHNICAL FIELD

The present invention relates to a flexible tactile actuator.

BACKGROUND

Haptics is a technique related to touch and specifically refers to a technique that allows a user of an electronic device to feel a touch, a force, and a sense of movement through a keyboard, a mouse, a joystick, and a touch screen. In the past, visual and auditory means have been mainly used as means of exchanging information between users and electronic devices, but recently, haptic technology has been attracting attention for more specific and realistic information transmission.

In general, a haptic providing device based on the haptic technology may include an inertial actuator, a piezoelectric actuator, and an electro-active polymer actuator (EAP).

The inertial actuator may include an eccentric rotation motor (ERM) that generates a vibration using an eccentric force generated by a body of weight connected to a magnetic circuit and a linear resonant actuator (LRA) that maximizes an intensity of vibration using a resonance frequency generated by the body of weight connected to the magnetic circuit and an elastic spring.

In terms of a linear resonance actuator in the haptic providing device of the related art, there are Korean Patent Registration No. 10-1461274 (entitled: LINEAR MOTOR) and Korean Patent Laid-open Publication No. 10-2016-0021160 (entitled: SPRING AND LINEAR VIBRATION MOTOR THEREWITH). However, such actuators may be provided with a relatively large volume and difficult to meet a predetermined space limitation.

The piezoelectric actuator may be a device that is driven in a form of a bar or a disk using an elastic body or the like based on a piezoelectric element of which an external shape changes instantaneously by an electric field. In the related art, there are Korean Patent Registration No. 10-1075263 (entitled: A HAPTIC ACTUATOR USING CELLULOSE ELECTRO-ACTIVE PAPER FILM) and U.S. Patent Application Publication No. US2014/0145555 (entitled: THIN-FILM PIEZOELECTRIC ELEMENT, THIN-FILM PIEZO-ELECTRIC ACTUATOR, THIN-FILM PIEZOELECTRIC SENSOR, HARD DISK DRIVE, AND INKJET PRINTER APPARATUS). However, such techniques may require a voltage of hundreds of volts in order to provide a suitable effect for a haptic application. Also, the techniques may have a limitation in that it is fragile in bending and thus, may not ensure a sufficient durability life.

The EAP may be a device that is driven based on repetitive movements provided by attaching an electro-active polymer film to a mass. The EAP may be based on a principle that a shape of the electro-active polymer film is changed by a functional group of a polymer backbone having a specific mechanism by external electric power. In the related art, there are U.S. Patent Application Publication No. US2013/0335354 (entitled: ULTRA-THIN INERTIAL ACTUATOR) and U.S. Patent Application Publication No. US2014/081879 (entitled: SYSTEM INCLUDING ELECTROMECHANICAL POLYMER SENSORS AND ACTUATORS). The techniques may have an issue of degradation in durability due to an external oxidation and may require a voltage of hundreds of volts for the haptic application.

In addition to the haptic providing device, there is U.S. Patent Application Publication No. US2011/0173970 (entitled: FLEXIBLE ACTUATOR BASED ON SHAPE MEMORY ALLOY SHEET) disclosing a technique that is flexible and available for the haptic application by using a shape memory alloy. However, the technique may have a disadvantage in that a high temperature is required and a crack is to occur, which makes it difficult to stably operate for a long period of time.

Accordingly, there is a desire for research on a tactile sense transmitting structure that is thin, flexible, operable at a low voltage, and applicable to various types of devices such that more emotional and complex information is effectively transmitted in addition to a simple vibration.

SUMMARY

Technical Goals

An aspect provides a flexible tactile actuator that is thin, small-sized, and flexible to be applicable to various types of devices.

Another aspect provides a flexible tactile actuator that is capable of providing a tactile sense of a local or the entire electronic device and controlling a frequency or an intensity in a magnetic field generator, thereby transmitting a tactile sense such as 'tapping' to a user in addition to a vibration.

Still another aspect provides a flexible tactile actuator that is attachable to an inside and an outside of an information technology (IT) device such as a virtual reality (VR) glove, a game controller, and a smart wear to directly hit a skin of a user, thereby transmitting a local touch and a real-time tactile feedback.

Technical Solutions

According to an aspect, there is provided a flexible tactile actuator including a tactile transmitter configured to be flexible and including magnetic particles capable of being polarized in response to an external magnetic field and a matrix layer including the magnetic particles, a magnetic field generator disposed below the tactile transmitter and configured to generate a magnetic field in the tactile transmitter, and an elastic member provided in a shape of a film, having at least a portion in surface contact with the magnetic field generator, and attached to be in surface contact with one of a top surface and a bottom surface of the tactile transmitter.

A modulus of elasticity of the elastic member may be less than a modulus of elasticity of the tactile transmitter.

Both end portions of the elastic member may be bent inwardly or outwardly to be attached to a top surface of the magnetic field generator.

The tactile transmitter may be attached to the top surface of the elastic member.

The tactile transmitter may be attached to a bottom surface of the elastic member.

According to another aspect, there is also provided a flexible tactile actuator including a tactile transmitter configured to be flexible and including magnetic particles capable of being polarized in response to an external magnetic field and a matrix layer including the magnetic particles, a magnetic field generator disposed below the tactile transmitter and configured to generate a magnetic field in the tactile transmitter, an elastic member disposed on the magnetic generator and having an upper portion formed to be open, and a polymer cover connected to the elastic member to cover the upper portion of the elastic member, wherein a top surface of the tactile transmitter is attached to be in surface contact with a bottom surface of the polymer cover.

The polymer cover may have a thickness less than a thickness of the elastic member and include a material more flexible than a material of the elastic member.

The tactile transmitter may be a magneto-rheological elastomer.

The magnetic field generator may be formed of a flexible material to be bent.

The magnetic field generator may include an insulating film and a first magnetic field generating circuit printed on one of two surfaces of the insulating film and wound a plurality of times in a form of a circle, an oval, or a polygon.

The magnetic field generator may further include a second magnetic field generating circuit printed on the other of the two surfaces of the insulating film and wound a number of times in a form of a circle, an oval, or a polygon.

The magnetic field generator may include a plurality of flexible printed circuit boards attached using an adhesive, and each of the plurality of flexible printed circuit boards may include a magnetic field generating circuit to generate a magnetic field.

At least a portion of the tactile transmitter may be spaced upwardly apart from the magnetic field generator at a height ranging between 0.1 millimeters (mm) and 3 mm The matrix layer may have a tensile strength ranging between 0.02 newtons per square millimeter (N/mm^2) and 8.85 N/mm^2, and the matrix layer may have an elongation percentage ranging between 65% and 700%.

The elastic member may have a young's modulus ranging between 0.5 gigapascals (GPa) and 6.1 GPa.

An amount of the magnetic particles included in the tactile transmitter may range from 4% by volume (vol %) to 60 vol %.

The elastic member may be formed of at least one of polyethylene terephthalate and polyimide.

According to still another aspect, there is also provided a method of manufacturing a flexible tactile actuator, the method including inserting a matrix material into a prepared mold, inserting magnetic particles into the matrix material, evenly mixing the matrix material and the magnetic particles, inserting a curing agent into the matrix material, applying a magnetic field vertically to a tactile transmitter, attaching an elastic member such that at least a portion of the elastic member is in surface contact with one of a top surface and a bottom surface of the tactile transmitter, and attaching a magnetic field generator such that at least a portion of the elastic member is in surface contact with a top surface of the magnetic field generator.

Effects

According to an aspect, it is possible to provide a flexible tactile actuator that provides various senses of touching.

According to another aspect, it is possible to provide a flexible tactile actuator that is thin, small-sized, and flexible to be applicable to various types of devices.

According to still another aspect, it is possible to provide a flexible tactile actuator that includes an elastic member connected to a tactile transmitter to amplify a movement of the tactile transmitter and secure a space for a vertical movement during an operation.

BRIEF DESCRIPTION OF DRAWINGS

FIG. 7 is a diagram illustrating a flexible tactile actuator in a first shape or a second shape according to an example embodiment.

FIG. 8 is a diagram illustrating a flexible tactile actuator in a first shape or a second shape according to an example embodiment.

DETAILED DESCRIPTION

Figure 1:
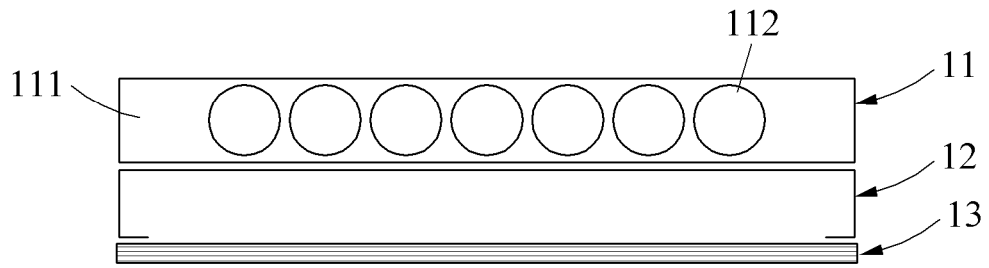
FIG. 1 is a cross-sectional view illustrating a flexible tactile actuator according to an example embodiment.

Hereinafter, some example embodiments will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

In addition, terms such as first, second, A, B, (a), (b), and the like may be used herein to describe components. Each of these terminologies is not used to define an essence, order or sequence of a corresponding component but used merely to distinguish the corresponding component from other component(s). It should be noted that if it is described in the specification that one component is "connected", "coupled", or "joined" to another component, a third component may be "connected", "coupled", and "joined" between the first and second components, although the first component may be directly connected, coupled or joined to the second component.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

FIG. 1 is a cross-sectional view illustrating a flexible tactile actuator according to an example embodiment.

Referring to FIG. 1, a flexible tactile actuator 10 may be sufficiently thin and flexible to provide various types of tactile senses. The flexible tactile actuator 10 may be formed as, for example, a quadrangular or circular panel. A shape of the flexible tactile actuator 10 may vary depending on examples.

The flexible tactile actuator 10 may include a tactile transmitter 11, an elastic member 12, and a magnetic field generator 13.

The tactile transmitter 11 may perform a movement such as vibration in response to an external magnetic field such that a user receives various tactile senses through the movement. Also, the tactile transmitter 11 may be configured to be thin and flexible.

The tactile transmitter 11 may include a matrix layer 111 in a shape of, for example, a rectangular parallelepiped and a cylinder, and magnetic particles 112.

The matrix layer 111 may be a material configuring external shape and texture of the tactile transmitter 11, have a shape of a rectangular parallelepiped or a cylinder, and include the magnetic particles 112. For example, the matrix layer 111 may enhance durability of the tactile transmitter 11 and used to arrange the magnetic particles 112 evenly or in a predetermined direction.

The matrix layer 111 may be formed of a rubber, plastic, or polymer material such as elastic silicone, polyurethane, nitrile, polyethylene, polypropylene, polyvinyl alcohol, and the like to enable the tactile transmitter 11 to be bent.

The matrix layer 111 may be formed of a material having a tensile strength ranging between 0.02 newtons per square millimeter (N/mm^2) and 8.85 N/mm^2, and an elongation percentage ranging between 65% and 700%. Also, in the matrix layer 111, the magnetic particles 112 may be distributed evenly or in a predetermined direction.

The magnetic particles 112 may be arranged in the matrix layer 111 and evenly distributed in the matrix layer 111. For example, the matrix layer 111 may move in response to the magnetic particles 112 that responds to a magnetic field applied from the magnetic field generator 13. Through such movement, the flexible tactile actuator 10 may be driven.

For example, in order to maximize a change in vertical movement by the magnetic field generator 13, the larger greater the residual magnetic density and the coercive force value of the magnetic particles 112, the more desirable. Also, the magnetic particles 112 may be formed without restrictions on a shape and may be formed in, for example, in a globular shape or a flake shape having a high aspect ratio with magnetic anisotropy.

The magnetic particles 112 may include at least one of metal elements such as iron, nickel, and cobalt, and ferrite elements. Also, the magnetic particles 112 may be materials such as powder, an alloy, alloy powder, and composites including at least one rare earth element such as samarium and neodymium. For example, the magnetic particles 112 may each be in a size between 0.01 and 100 micrometers (μm).

The tactile transmitter 11 may be formed as a magneto rheological elastomer (MRE). The magneto rheological elastomer may be an elastomeric material including particles capable of reacting to an external magnetic field. The elastomeric material may include the magnetic particles 112 to be magnetized by the external magnetic field.

Properties, for example, a rigidity, a tensile strength, and an elongation percentage of the magneto rheological elastomer may be changed in response to the external magnetic field being applied.

The elastic member 12 may secure a space for a vertical movement of the tactile transmitter 11. The elastic member 12 may amplify a movement of the tactile transmitter 11. As illustrated in FIG. 1, the elastic member 12 may be a film-shaped member connected to a bottom of the tactile transmitter 11 and cover a top of the magnetic field generator 13. For example, at least a portion of the elastic member 12 may be attached to be in surface contact with a top surface of the magnetic field generator 13.

The elastic member 12 may be, for example, a thin polymer film. As illustrated in FIG. 1, the elastic member 12 may be connected to the magnetic field generator 13 from edges thereof. Also, an outer edge of the elastic member 12 a predetermined spaced apart from the magnetic field generator 13 may cover the magnetic field generator 13 whereby the elastic member 12 has a shape that an inside is empty.

One of a top surface and a bottom surface of the elastic member 12 may be fixed to be in contact with one of a top surface and a bottom surface of the tactile transmitter 11. In this example, by selecting the elastic member 12 as required, the tactile transmitter 11 may have a different movement characteristic from a property of the tactile transmitter 11.

In an example, to increase a force generated by the tactile transmitter 11, a modulus of elasticity of the elastic member 12 may be set to be greater than a modulus of elasticity of the tactile transmitter 11.

In another example, to increase a maximum displacement of the tactile transmitter 11, the modulus of elasticity of the elastic member 12 may be set to be less than the modulus of elasticity of the tactile transmitter 11.

The elastic member 12 may include at least one of polymer materials such as elastic polyimide, polyethylene phthalate, polypropylene, and polyethylene naphthalene, have a heat resistance of 75 degrees Celsius or more, and have a young's modulus ranging between 0.5 gigapascals (GPa) and 6.1 GPa. Related explanation will be further described with reference to FIG. 13 and Table 1 below.

Both end portions of the elastic member 12 may be bent inwardly or outwardly such that the bent end portions are attached to the top surface of the magnetic field generator 13. For example, the bent end portions of the elastic member 12 may be attached to be in surface contact with the top surface of the magnetic field generator 13.

The elastic member 12 may be in various shapes such as a quadrangle, a circle, a line, a spiral, and a clip when viewed from above. Also, a height of the elastic member 12 may range between 0.1 millimeters (mm) and 3 mm. Related explanation will be further described with reference to FIG. 10.

As illustrated in FIG. 1, the magnetic field generator 13 may be disposed below the elastic member 12, and apply a magnetic field to the tactile transmitter 11 to implement the movement of the tactile transmitter 11.

The magnetic field generator 13 may include, for example, a circular or polygonal shaped plane coil or solenoid coil. The magnetic field generator 13 may include, for example, a flexible printed circuit board configured to be bent.

When the magnetic field generator 13 includes the flexible printed circuit board, the magnetic field generator 13 may include an insulating film 131, a magnetic field generating circuit 132, and a solder pad 133. A configuration of the magnetic field generator 13 will be further described with reference to FIG. 4.

Figure 2:
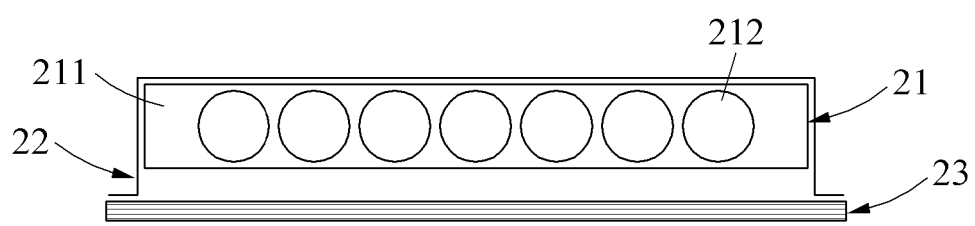
FIG. 2 is a cross-sectional view illustrating a flexible tactile actuator according to an example embodiment.

FIG. 2 is a cross-sectional view illustrating a flexible tactile actuator according to an example embodiment.

Referring to FIG. 2, a flexible tactile actuator 20 may include a tactile transmitter 21, an elastic member 22, and a magnetic field generator 23.

Unlike FIG. 1, the tactile transmitter 21 may be disposed between the elastic member 22 and the magnetic field generator 23. For example, the tactile transmitter 21 may be attached to be in surface contact with a bottom surface of the elastic member 22.

Here, a height of the elastic member 22 may be greater than a height of the elastic member 12 of FIG. 1.

Figure 3:
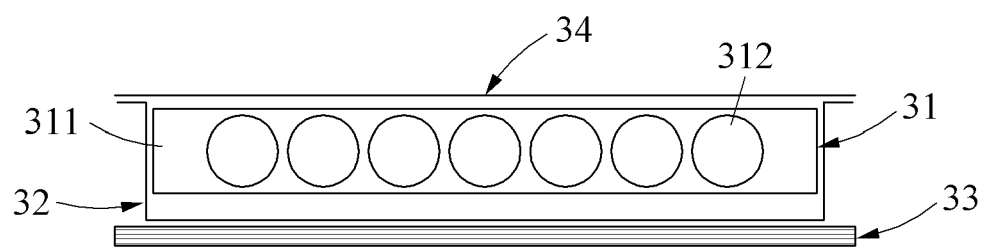
FIG. 3 is a cross-sectional view illustrating a flexible tactile actuator according to an example embodiment.

FIG. 3 is a cross-sectional view illustrating a flexible tactile actuator according to an example embodiment.

Referring to FIG. 3, a flexible tactile actuator 30 may include a tactile transmitter 31, an elastic member 32, a magnetic field generator 33, and a polymer cover 34.

The polymer cover 34 may be space apart from the magnetic field generator 33 to cover the elastic member 32 and the tactile transmitter 31. For example, the polymer cover 34 may be formed of a material more flexible than the elastic member 32 and structurally thinner than the elastic member 32.

Unlike FIGS. 1 and 2, the elastic member 32 may be connected to a bottom surface of the polymer cover 34. In this example, a bottom surface of the elastic member 32 may be in contact with the magnetic field generator 33.

The tactile transmitter 31 may be disposed between the polymer cover 34 and the elastic member 32. For example, the tactile transmitter 31 may be fixed to be in surface contact with the bottom surface of the polymer cover 34. In this example, by selecting the polymer cover 34 as required, the tactile transmitter 31 may have a different movement characteristic from a property of the tactile transmitter 31.

Figure 4:
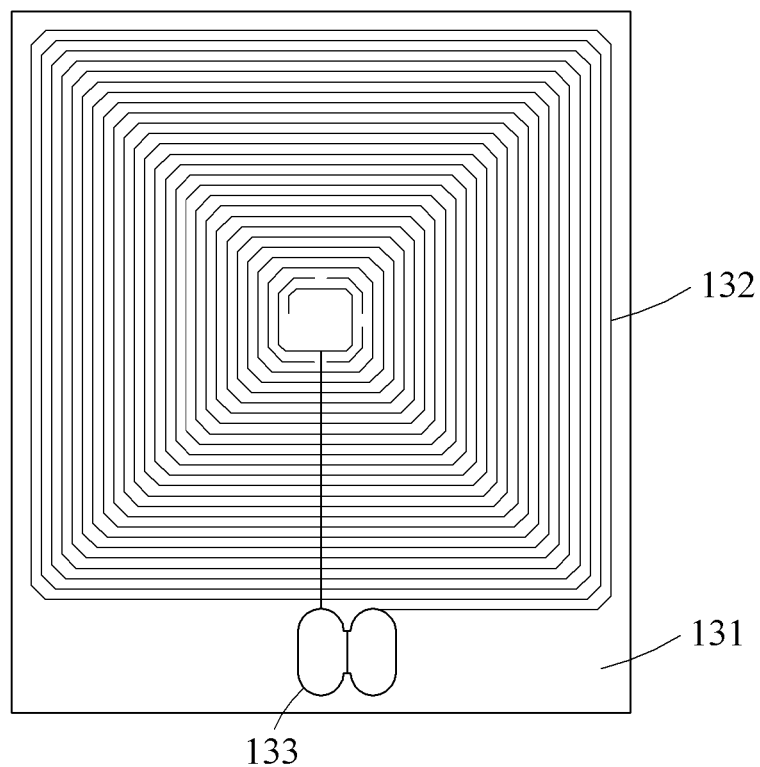
FIG. 4 is a diagram illustrating a magnetic field generator according to an example embodiment.

FIG. 4 is a diagram illustrating a magnetic field generator according to an example embodiment.

Referring to FIG. 4, the magnetic field generator 13 may be formed as a flexible printed circuit board and include the insulating film 131, the magnetic field generating circuit 132, an adhesive 134, and the solder pad 133.

The insulating film 131 a thin and flexible insulator. The magnetic field generating circuit 132, the adhesive 134, and the solder pad 133 may be arranged on the insulating film 131. The insulating film 131 may be a polyimide film having a thickness of 35 μm.

The magnetic field generating circuit 132 may be formed of a copper as a coil configured to generate a magnetic field by receiving a voltage. The magnetic field generating circuit 132 may be printed on at least one of two surfaces of the insulating film 131.

The magnetic field generating circuit 132 may be wound a plurality of times in a form of a circle, an oval, or a polygon, and configured to change a direction of a magnetic field force by changing a direction of a current applied to the magnetic field generating circuit.

For example, the magnetic field generating circuit 132 may be formed with a copper wire plated with a thickness of 20 μm and wound by 25 turns.

The adhesive 134, in a manufacturing process of the flexible printed circuit board, may be applied between the magnetic field generating circuit 132 and the insulating film 131 to attach the magnetic field generating circuit 132 to the insulating film 131.

The solder pad 133 may be connected to both ends of a circuit wire of the magnetic field generating circuit 132 to be exposed externally to the insulating film 131.

Figure 5:
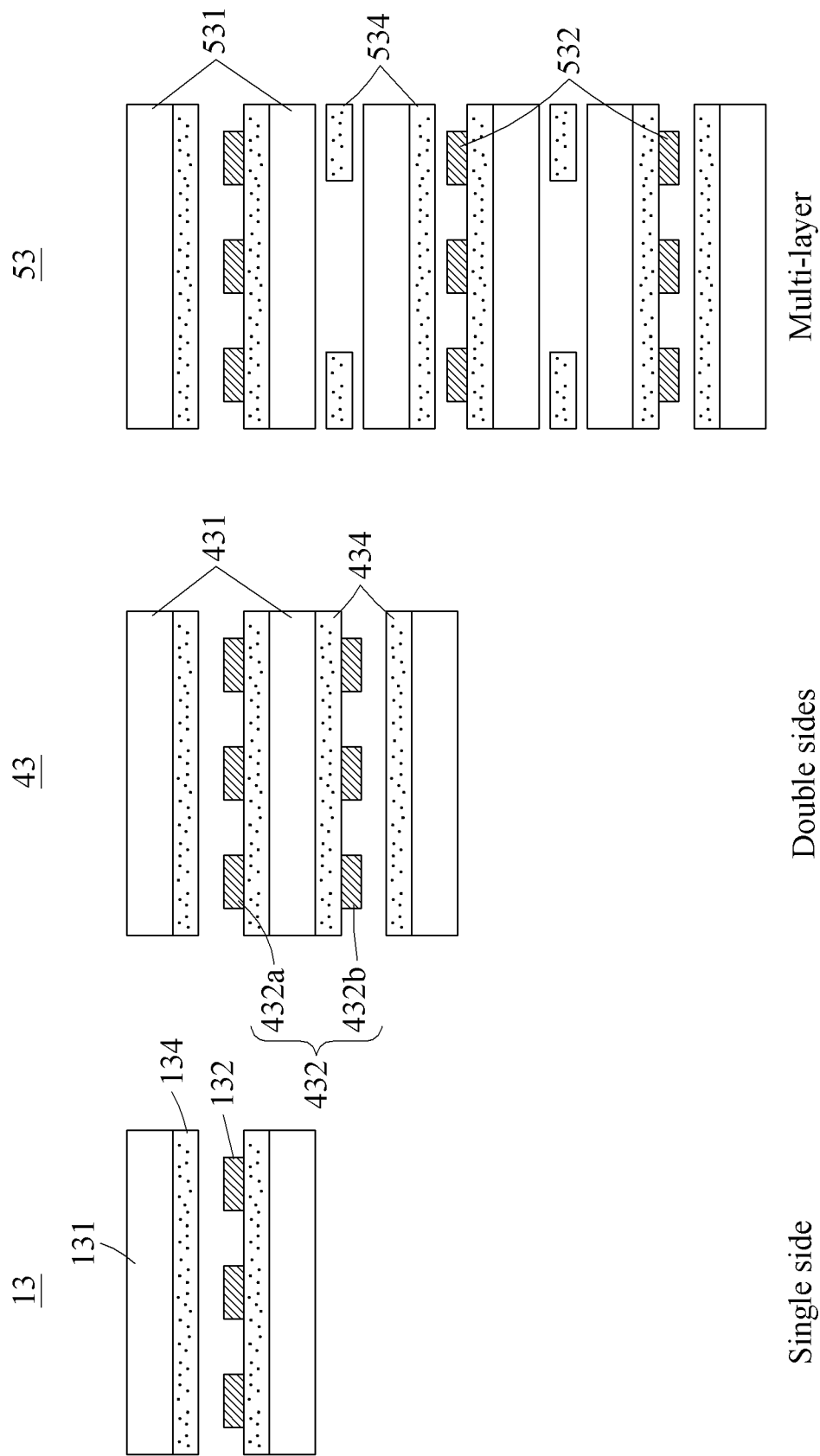
FIG. 5 illustrates examples of a magnetic field generator.

FIG. 5 illustrates examples of a magnetic field generator.

Referring to FIG. 5, magnetic field generators 13, 43, and 53 may be provided as flexible printed circuit boards in forms of a single-sided shape, a double-sided shape, and a multi-layered shape.

When the magnetic field generator 13 is formed in the single-sided shape, the magnetic field generating circuit 132 may be printed on a surface of one side of the insulating film 131. For example, the insulating film 131 may be additionally attached to the surface on which the magnetic field generating circuit 132 is printed. Also, the adhesive 134 may be applied between the insulating film 131 and the magnetic field generating circuit 132.

When the magnetic field generator 43 is formed in the double-sided shape, a magnetic field generating circuit 432 may include a first magnetic field generating circuit 432*a* printed on one of two surfaces and a second magnetic field generating circuit 432*b* printed on the other of the two surfaces.

Here, the first and second magnetic field generating circuits 432*a* and 432*b* may be arranged such that coils are wound in the same direction. For example, the first and second magnetic field generating circuits 432*a* and 432*b* may be a single circuit connected through a hole formed on an insulating film 431 disposed therebetween.

For example, the insulating film 431 may be additionally attached to the two surfaces on which the magnetic field generating circuit 432 is printed. Also, an adhesive 434 may be applied between the insulating film 431 and the magnetic field generating circuit 432.

When the magnetic field generator 53 is formed in the multi-layered shape, the magnetic field generator 53 may be in a structure in which a plurality of the magnetic field generators 13 formed in the single-sided shape is laminated. In this example, an adhesive 534 may be applied between the magnetic field generators 13 to be attached to one another.

Here, the plurality of the magnetic field generators 53 formed in the multi-layered shape may be arranged such that magnetic field generating circuits 532 rotate in the same direction.

Figure 6:
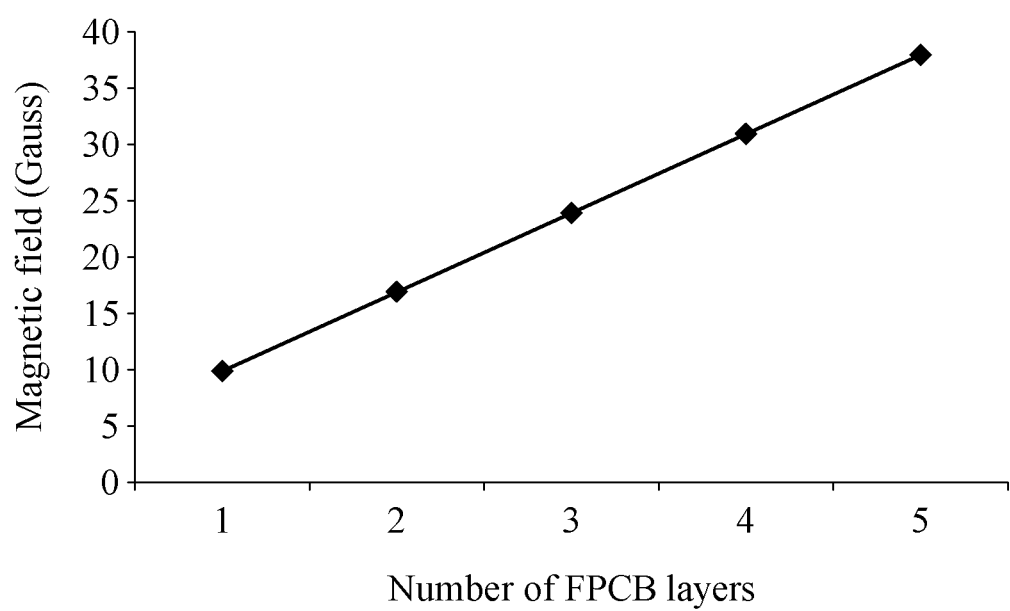
FIG. 6 is a graph representing an intensity of a magnetic field based on a number of layers of a flexible printed circuit board.

FIG. 6 is a graph representing an intensity of a magnetic field based on a number of layers of a flexible printed circuit board.

Referring to FIG. 6, as described with reference to FIG. 5, when the magnetic field generator 53 is provided as a multi-layered flexible printed circuit board, an intensity of a magnetic field generated by the magnetic field generator 53 may be verified based on a change in a number of layers of the multi-layered flexible printed circuit board.

As shown in the graph of FIG. 6, the intensity of a magnetic field generated by the magnetic field generator 53 may be linearly increased as the number of layers of the multi-layered flexible printed circuit board increases.

Figure 9:
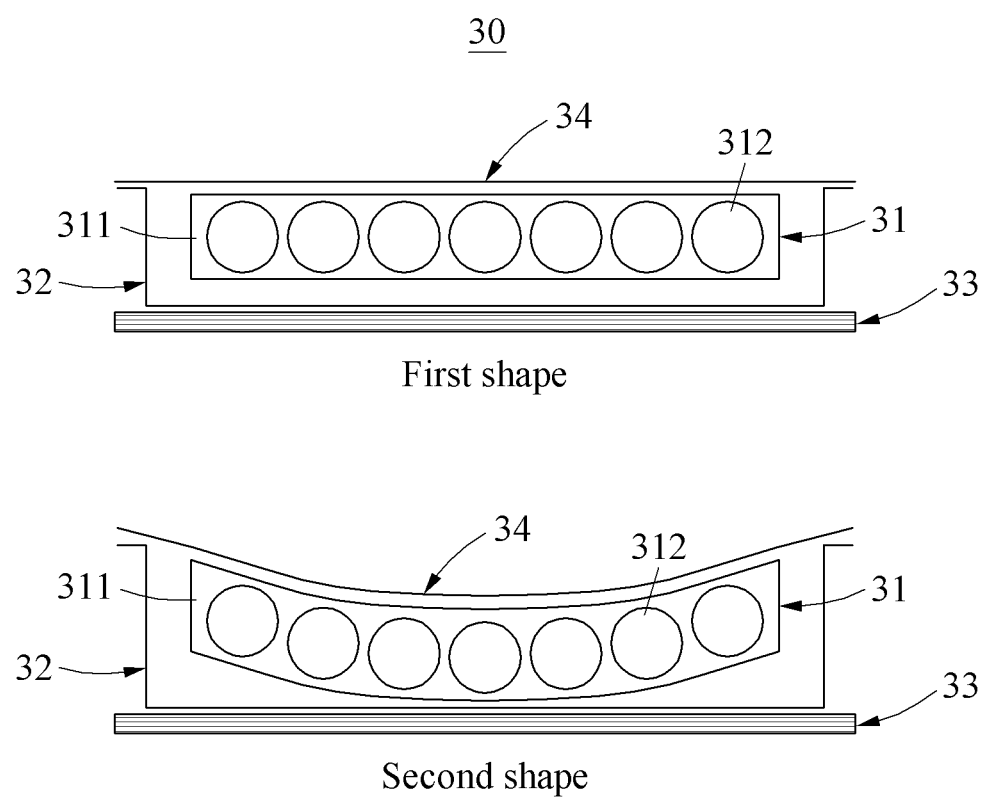
FIG. 9 is a diagram illustrating a flexible tactile actuator in a first shape or a second shape according to an example embodiment.

FIGS. 7 through 9 are diagrams illustrating examples of a flexible tactile actuator in a first shape or a second shape according to an example embodiment.

Referring to FIGS. 7 through 9, when the flexible tactile actuators 10, 20, and 30 are not affected by a magnetic field generated by the magnetic field generators 13, 23, and 33, the tactile transmitters 11, 21, and 31 may be smoothly maintained in a first shape. When the magnetic field is applied from the magnetic field generators 13, 23, and 33, the tactile transmitters 11, 21, and 31 may be bent toward the magnetic field generators 13, 23, and 33 by an attractive force received from the magnetic field so as to be in a second shape, for example, a shape in which a central portion of the tactile transmitter 11 is bent downward as illustrated in FIG. 7.

In response to the tactile transmitter 11 being bent downward, a top surface of the elastic member 12 formed of a thin and elastic material may also be bent toward the magnetic field generator 13 in parallel with the tactile transmitter 11. In this example, an inner space formed by the elastic member 12 in the first shape may also be recessed downward.

Referring to FIG. 8, when the tactile transmitter 21 of the flexible tactile actuator 20 of FIG. 2 receives the magnetic field and is deformed to be in the second shape, the tactile transmitter 21 may be bent downward. In this example, because the elastic member 22 is connected to a top surface of the tactile transmitter 21, a central portion of a top surface of the elastic member 22 may be recessed downward and thus, the elastic member 22 may also be bent similarly to the tactile transmitter 21.

Referring to FIG. 9, when the tactile transmitter 31 of the flexible tactile actuator 30 of FIG. 3 receives the magnetic field and is deformed to be in the second shape, the tactile transmitter 31 may be bent downward. In this example, because the polymer cover 34 is connected to a top surface of the tactile transmitter 31, a central portion of a top surface of the polymer cover 34 may be recessed downward and thus, the polymer cover 34 may also be bent similarly to the tactile transmitter 31.

Figure 10:
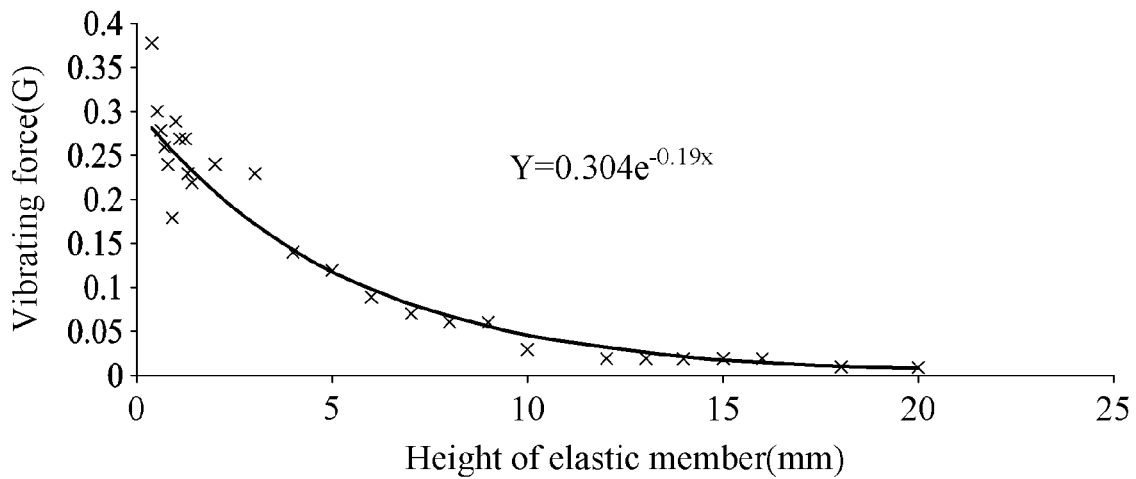
FIG. 10 is a graph representing an intensity of a vibrating force generated in a tactile transmitter based on a height of an elastic member according to an example embodiment.

FIG. 10 is a graph representing an intensity of a vibrating force generated in a tactile transmitter based on a height of an elastic member according to an example embodiment.

Specifically, FIG. 10 is a graph obtained by interpolating data that is obtained by measuring the intensity of the vibrating force applied to the tactile transmitter 11 while varying the height of the elastic member 12 of the flexible tactile actuator 10 of FIG. 1.

Referring to FIG. 10, the intensity of the vibrating force generated in the tactile transmitter 11 may decrease as the height of the elastic member 12, that is, a distance between the magnetic field generator 13 and the tactile transmitter 11 decreases. Also, a change in an intensity of a magnetic field and the height of the elastic member 12 may be obtained using the following equation.

$$Y=0.304e^{(-0.19x)} \qquad \text{[Equation 1]}$$

As shown in Equation 1 of FIG. 10, it can be known that the height (, for example, x in Equation 1) of the elastic member 12 ranges from 0.1 mm to 3 mm when an intensity of a vibrating force that a user is able to perceive through a tactile sense is about 0.2 G (the acceleration of gravity) or more.

Figure 11:
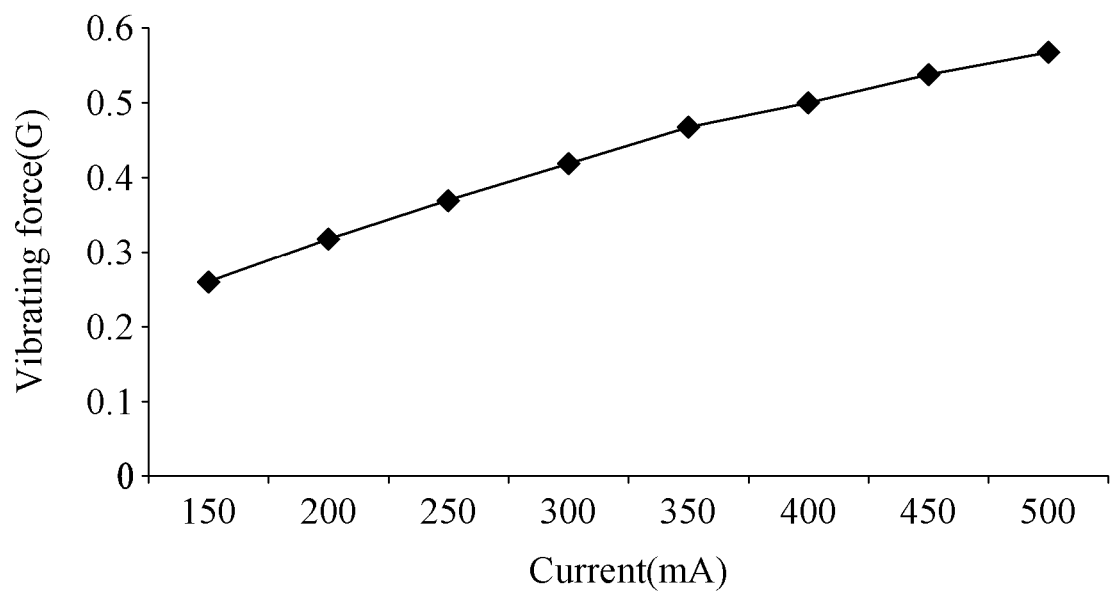
FIG. 11 is a graph representing an intensity of a vibrating force generated in a tactile transmitter based on an amount of current applied to a flexible tactile actuator according to an example embodiment.

FIG. 11 is a graph representing an intensity of a vibrating force generated in a tactile transmitter based on an amount of current applied to a flexible tactile actuator according to an example embodiment.

Referring to FIG. 11, when an amount of current applied to the flexible tactile actuator 10 increases, the intensity of the vibrating force generated in the tactile transmitter 11 may linearly increase.

Figure 12:
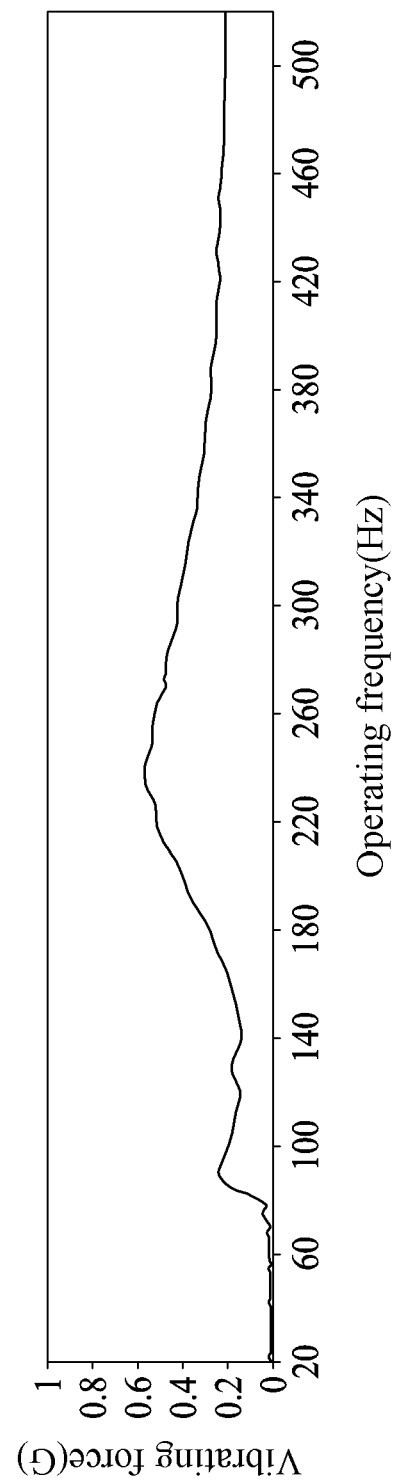
FIG. 12 is a graph representing an intensity of a vibrating force generated based on a frequency of a driving power applied to a flexible tactile actuator according to an example embodiment.

FIG. 12 is a graph representing an intensity of a vibrating force generated based on a frequency of a driving power applied to a flexible tactile actuator according to an example embodiment.

Referring to FIG. 12, when an intensity of a vibrating force that a user is able to perceive through a tactile sense is about 0.2 G or more, a flexible tactile actuator may exert at least 0.2 G vibrating force in a driving power frequency band ranging from 90 hertz (Hz) and to 500 Hz and exceeding 500 Hz, and have a relatively wide operating frequency band.

Figure 13:
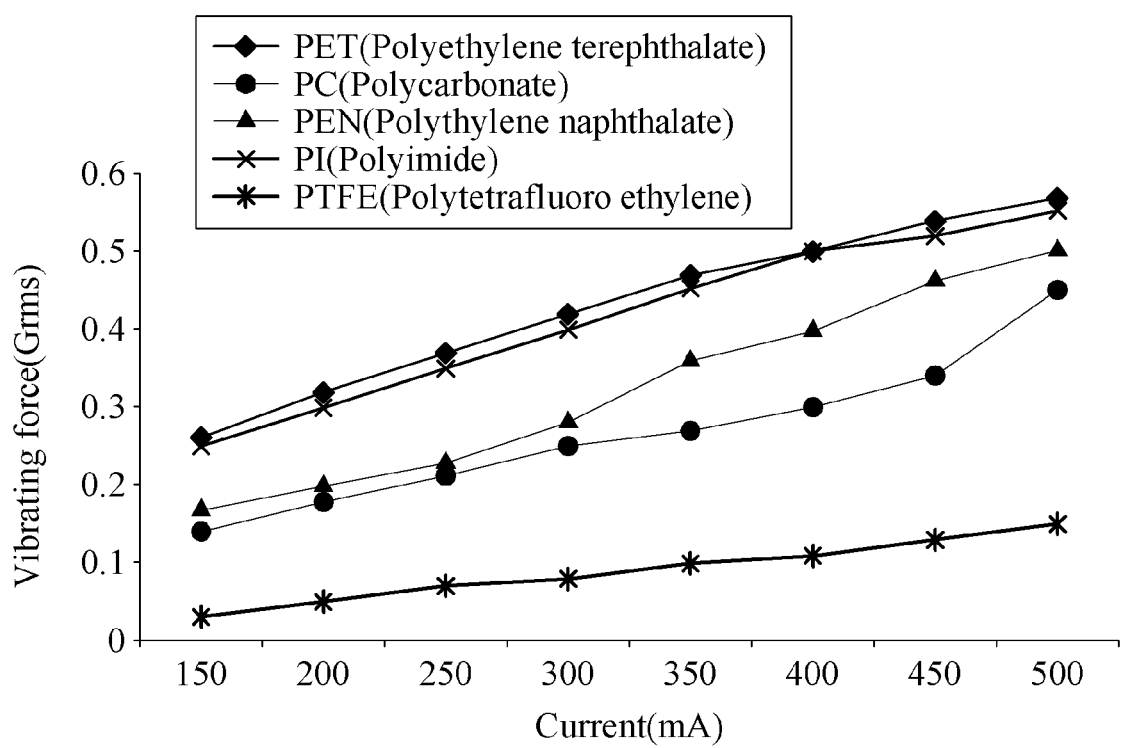
FIG. 13 is a graph representing an intensity of a vibrating force generated in a tactile transmitter based on a type of an elastic member according to an example embodiment.

FIG. 13 is a graph representing an intensity of a vibrating force generated in a tactile transmitter based on a type of an elastic member in the flexible tactile actuator 10 according to an example embodiment.

Specifically, FIG. 13 is a graph representing an intensity of a vibrating force based on amount of current applied to the flexible tactile actuator 10 when polyethylene terephthalate, polycarbonate, polyethylene naphthalate, polyimide, and polytetrafluoro ethylene are used among polymer materials suitable for a material of the elastic member 12.

Referring to FIG. 13, when the elastic member 12 is formed of polyethylene terephthalate and polyimide, the vibration force may be significantly higher in comparison to a case in which the elastic member 12 is formed of other materials.

Table 1 represents Young's modulus of each of the aforementioned polymer materials.

TABLE 1

| Polymer type | Poly-ethylene terephthalate | Poly-carbonate | Poly-ethylene naphthalate | Poly-imide | Poly-tetrafluoro ethylene |
|---|---|---|---|---|---|
| Young's modulus (Mpa) | 2723 | 2595 | 6080 | 2500 | 509 |

As shown in Table 1 of FIG. 13, considering the Young's modulus (, for example, in a unit of megapascal (Mpa)) of the polymer materials, when the polymer material used as an elastic member of the flexible tactile actuator 10 has a Young's modulus ranging between 2.5 GPa and 6.1 GPa, the vibration force may be greater than 0.1 Grms (root mean square acceleration) in an area in which an input current ranges from 150 milliampere (mA) and 500 mA.

Figure 14:
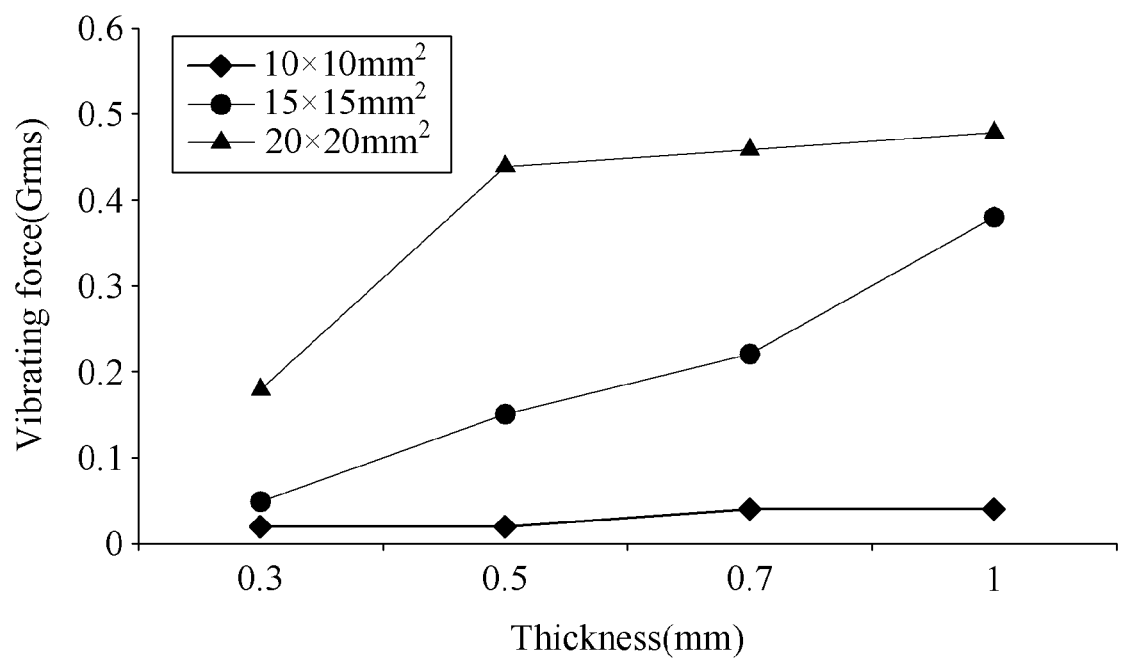
FIG. 14 is a graph representing an intensity of a vibrating force generated in a tactile transmitter based on a thickness of the tactile transmitter according to an example embodiment.

FIG. 14 is a graph representing an intensity of a vibrating force generated in the tactile transmitter 11 based on a thickness of the tactile transmitter 11 according to an example embodiment.

Specifically, FIG. 14 is a graph representing an intensity of a vibrating force generated in the tactile transmitter 11 based on a thickness of the tactile transmitter 11 when a size of the tactile transmitter 11 is 10 mm×10 mm, 15 mm×15 mm, and 20 mm×20 mm.

Referring to FIG. 14, the intensity of the vibrating force may increase as the size and the thickness of the tactile transmitter 11 increase. Also, it can be known that the tactile transmitter 11 desirably has at least a size of 15 mm×15 mm and a thickness of 0.5 mm or more.

Figure 15:
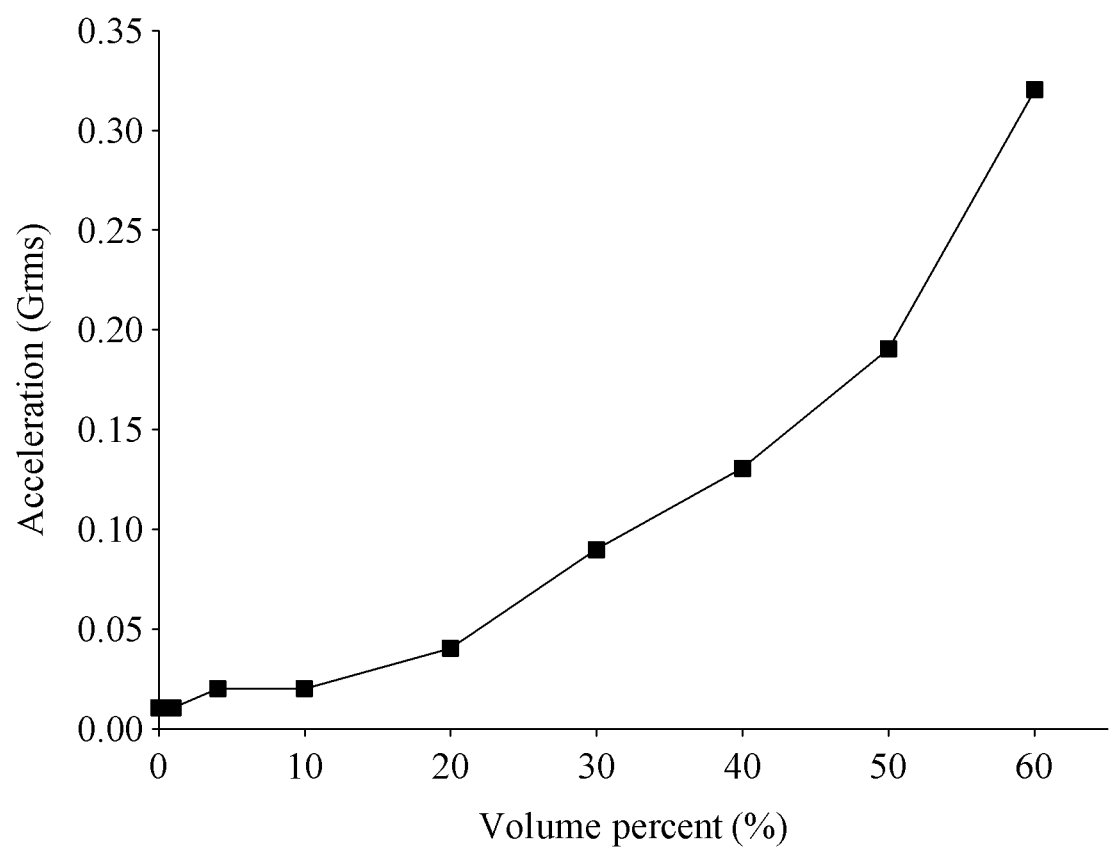
FIG. 15 is a graph representing an intensity of a vibrating force generated in a tactile transmitter based on an amount of magnetic particles included in the tactile transmitter according to an example embodiment.

FIG. 15 is a graph representing an intensity of a vibrating force generated in the tactile transmitter 11 based on an amount of the magnetic particles 112 included in the tactile transmitter 11 according to an example embodiment.

Referring to FIG. 15, the intensity of the vibrating force may increase as the amount of the magnetic particles 112 increases. Also, the vibrating force of the tactile transmitter 11 may be implemented by at least 4% by volume (vol %) of the amount of the magnetic particles 112 relative to the total volume of the tactile transmitter 11.

Figure 16:
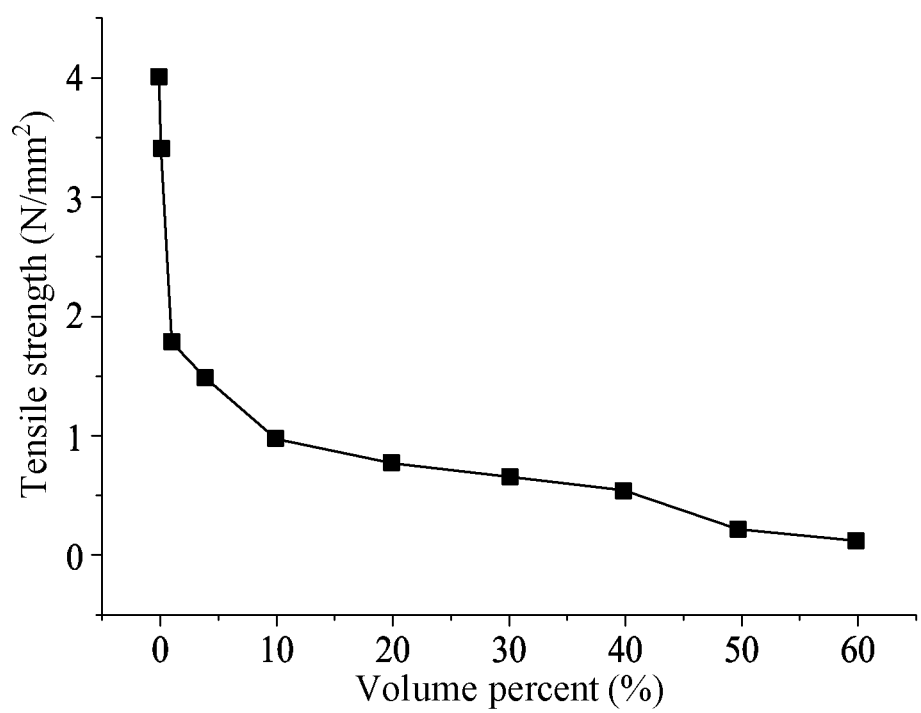
FIG. 16 is a graph representing a tensile strength of a tactile transmitter based on an amount of magnetic particles included in the tactile transmitter according to an example embodiment.

FIG. 16 is a graph representing a tensile strength of a tactile transmitter based on an amount of magnetic particles included in the tactile transmitter according to an example embodiment.

Referring to FIG. 16, the tensile strength of the tactile transmitter 11 may decrease as the amount of the magnetic particles 112 included in the tactile transmitter 11 increases.

The amount of the magnetic particles 112 relative to the total volume of the tactile transmitter 11 may be designed to be less than 60% such that the flexible tactile actuator 10 has a flexibility and maintains durability.

Figure 17:
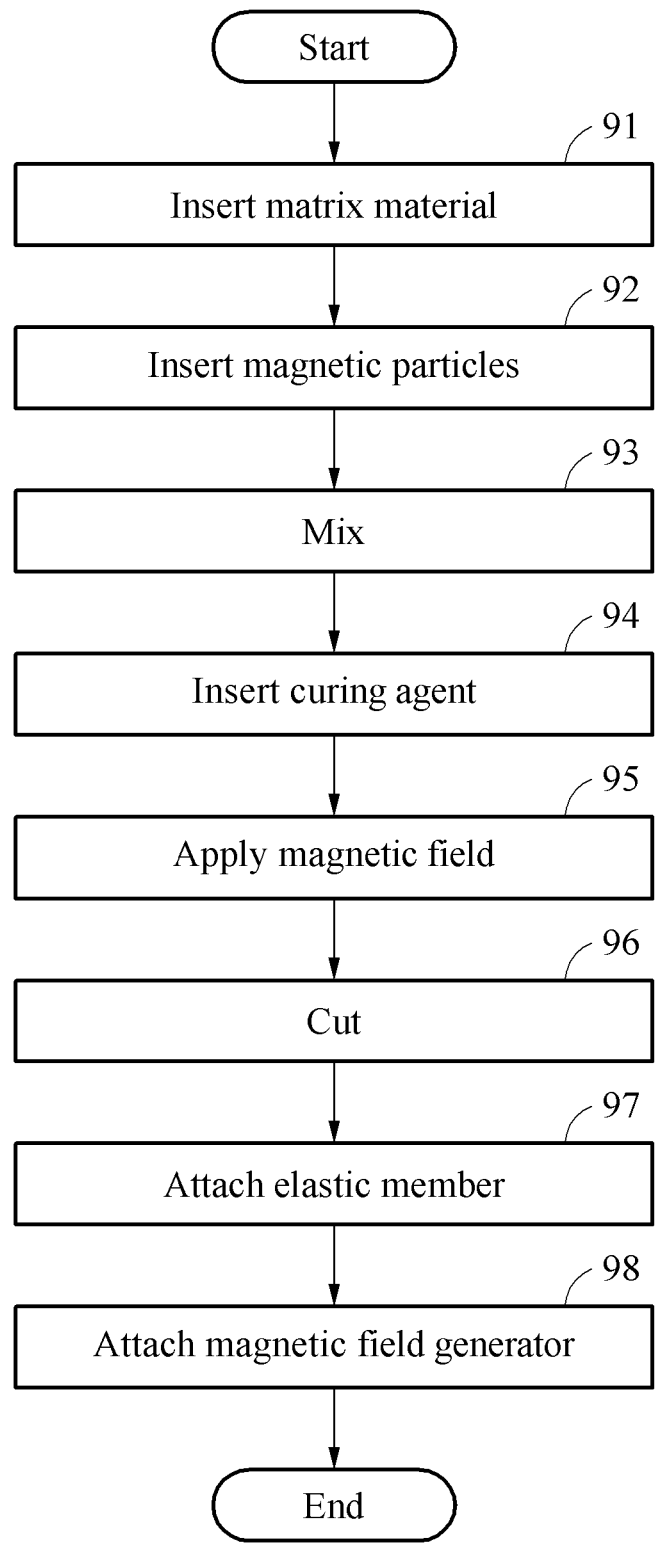
FIG. 17 is a flowchart illustrating a method of manufacturing a flexible tactile actuator according to an example embodiment.

FIG. 17 is a flowchart illustrating a method of manufacturing a flexible tactile actuator according to an example embodiment.

Referring to FIG. 17, a method of manufacturing a flexible tactile actuator may be a method of manufacturing the tactile transmitter 11 of the flexible tactile actuator 10 of FIG. 1. The method may insert a matrix material in operation 91, insert magnetic particles in operation 92, mix the matrix material and the magnetic particles in operation 93, insert a curing agent in operation 94, apply a magnetic field in operation 95, perform cutting in operation 96, attach an elastic member in operation 97, and attach a magnetic field generator in operation 98.

Operation 91 may be an operation of inserting a matrix material formed of a rubber, plastic, or polymer material into a prepared mold for mixing to form an external shape and texture of a tactile transmitter having an elasticity.

Here, the matrix material may be cured to be the matrix layer 111 of the flexible tactile actuator 10 as described with reference to FIG. 1.

Operation 92 may be performed simultaneously with, or before or after operation 91. Also, operation 92 may be an operation of inserting the magnetic particles 112 including at least one of magnetic powder, an alloy, alloy powder, and composites into the matrix material inserted into the mold for mixing, and an operation of inserting the magnetic particles 112 into the matrix material.

Operation 93 may be performed after operation 92. Also, operation 93 may be an operation of mixing such that the magnetic particles 112 are evenly distributed in the matrix material and, for example, an operation of physically mixing the matrix material and the magnetic particles 112.

Operation 94 may be an operation performed to cure the matrix material.

In operation 94, a curing agent may be inserted such that the magnetic particles 112 are fixed in the matrix material by solidifying the matrix material.

As illustrated in FIG. 17, for example, operation 94 may be performed after operation 93. However, unless the matrix material is completely cured before operation 95, operation 94 may be performed in any order.

Operation 95 may be an operation of applying a magnetic field to the matrix material in a predetermined direction to arrange the magnetic particles 112. Operation 95 will be further described with reference to FIG. 18.

Operation 96 may be an operation of cutting a tactile transmitter formed through operations 94 and 95 into a number of portions. For example, in operation 96, the tactile transmitter may be cut into a plurality of tactile transmitters 11 having predetermined side and shape. By performing operation 96, the plurality of tactile transmitters 11 may be formed in a single manufacturing process, which may reduce manufacturing cost and time. Operation 96 may also be omitted depending on examples.

Operation 97 may be an operation of attaching the elastic member 12 to the tactile transmitter 11. For example, at least a portion of the elastic member 12 may be attached to be in surface contact with one of a top surface and a bottom surface of the tactile transmitter 11.

Operation 98 may be an operation of attaching at least a portion of the elastic member 12 to be in surface contact with a top surface of the magnetic field generator 13. For example, both end portions of the elastic member 12 may be bent inwardly or outwardly such that the bent end portions are attached to be in surface contact with one surface of the magnetic field generator 13.

Figure 18:
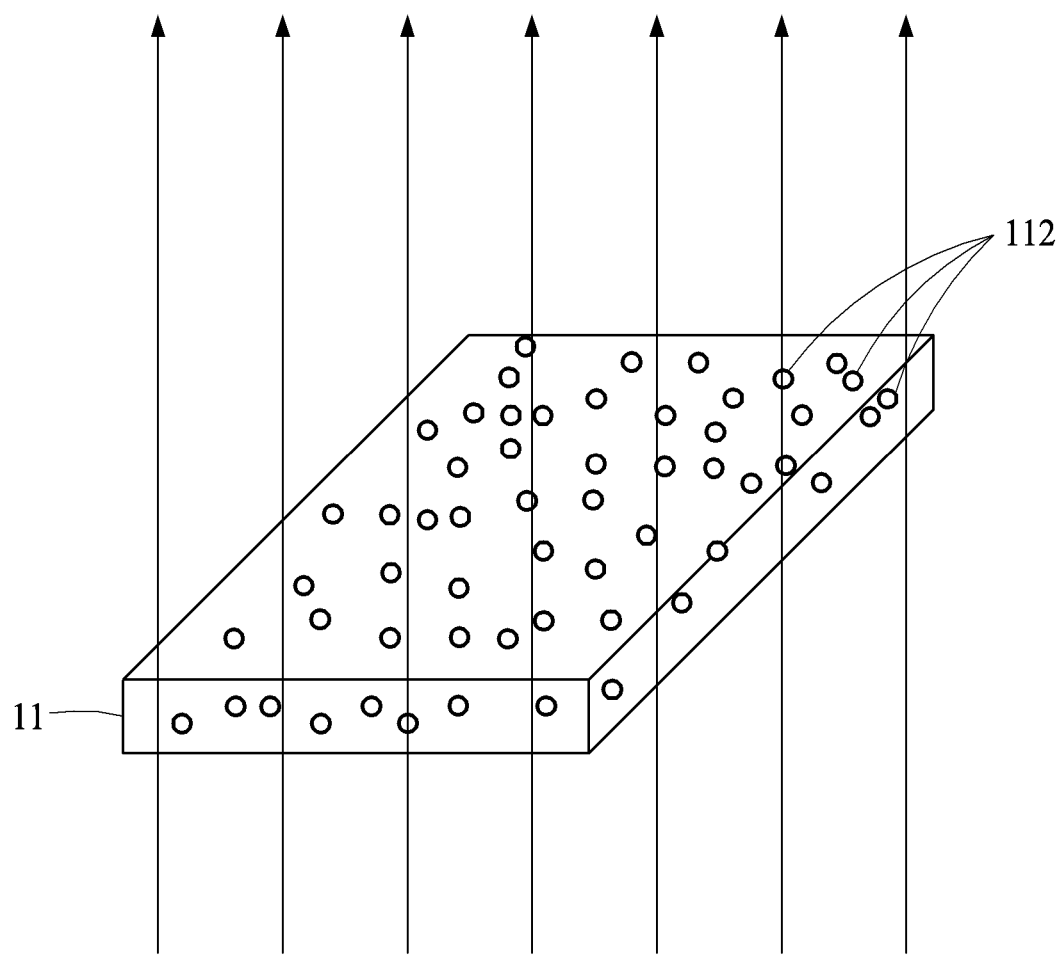
FIG. 18 is a diagram illustrating an operation of applying a magnetic field according to an example embodiment.

FIG. 18 is a diagram illustrating an operation of applying a magnetic field according to an example embodiment.

Referring to FIG. 18, operation 95 may be an operation of applying a magnetic field vertically to the tactile transmitter 11 to evenly arrange the magnetic particles 112 in the matrix material. The magnetic particles 112 may be evenly arranged perpendicularly to a vertical direction in which the tactile transmitter 11 including the matrix material and the magnetic particles 112 is to operate.

A direction of the magnetic field may be, for example, a direction from top to bottom and a direction from bottom to top. Operation 95 may be continually performed until the matrix material is completely cured by the curing agent inserted in operation 94.

As illustrated in FIG. 17, for example, operation 94 may be performed before operation 95. In an example, operation 94 may be performed while operation 95 is being performed. Also, operation 95 may be omitted depending on examples.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

The invention claimed is:

1. A tactile actuator comprising:
   a tactile transmitter containing magnetic particles;
   a magnetic field generator configured to apply a magnetic field to the tactile transmitter; and
   an elastic member connected to the tactile transmitter and disposed between the tactile transmitter and the magnetic field generator,
   wherein, as the magnetic field generator applies or does not apply a magnetic field to the tactile transmitter, at least a portion of the tactile transmitter moves relative to the magnetic field generator, thereby generating a vibrating force of 0.2 G or more.

2. The tactile actuator of claim 1,
wherein the tactile transmitter includes a matrix layer containing the magnetic particles, wherein the matrix layer has a tensile strength ranging from 0.02 newtons per square millimeter (N/mm^2) to 8.85 N/mm^2, and
wherein the matrix layer has an elongation percentage ranging from 65% to 700%.

3. The tactile actuator of claim 2,
wherein the elastic member is formed of a polymer having a Young's modulus ranging from 0.5 gigapascals (GPa) to 6.1 GPa.

4. The tactile actuator of claim 2,
wherein the elastic member is formed of at least one of polyethylene terephthalate and polyimide.

5. The tactile actuator of claim 2,
wherein at least a portion of the elastic member is in surface contact with the magnetic field generator, and at least a portion of the elastic member is in surface contact with the tactile transmitter.

6. The tactile actuator of claim 2,
wherein the tactile transmitter is a magneto-rheological elastomer.

7. The tactile actuator of claim 2,
wherein the magnetic field generator is formed of a flexible material that is bendable.

8. The tactile actuator of claim 2,
wherein the magnetic field generator includes:
a first magnetic field generating circuit printed on an insulating film and wound multiple times in a circular, oval, or polygonal shape.

9. The tactile actuator of claim 8,
wherein the magnetic field generator further includes:
a second magnetic field generating circuit printed on the insulating film and wound multiple times in a circular, oval, or polygonal shape.

10. The tactile actuator of claim 2,
wherein the magnetic field generator comprises:
a plurality of flexible printed circuit boards attached using an adhesive, and
wherein each of the plurality of flexible printed circuit boards comprises a magnetic field generating circuit to generate a magnetic field.

11. A tactile actuator comprising:
a tactile transmitter containing magnetic particles;
a magnetic field generator configured to apply a magnetic field to the tactile transmitter; and
an elastic member connected to the tactile transmitter,
wherein a distance between the tactile transmitter and the magnetic field generator ranges from 0.1 mm to 3 mm, and
wherein, as the magnetic field generator applies a magnetic field to the tactile transmitter, at least a portion of the tactile transmitter moves relative to the magnetic field generator.

12. The tactile actuator of claim 11,
wherein the tactile transmitter includes a matrix layer containing the magnetic particles,
wherein the matrix layer has a tensile strength ranging from 0.02 newtons per square millimeter (N/mm^2) to 8.85 N/mm^2, and
wherein the matrix layer has an elongation percentage ranging from 65% to 700%.

13. The tactile actuator of claim 11,
wherein the elastic member is formed of a polymer having a Young's modulus ranging from 0.5 gigapascals (GPa) to 6.1 GPa.

14. The tactile actuator of claim 11,
wherein at least a portion of the elastic member is in surface contact with the magnetic field generator, and at least a portion of the elastic member is in surface contact with the tactile transmitter.

15. The tactile actuator of claim 11,
wherein the tactile transmitter is a magneto-rheological elastomer.

16. A tactile actuator comprising:
a tactile transmitter containing magnetic particles;
a magnetic field generator configured to apply a magnetic field to the tactile transmitter; and
an elastic member connected to the tactile transmitter,
wherein a content of the magnetic particles relative to a volume of the tactile transmitter ranges from 4 vol % to 60 vol %,
wherein the tactile transmitter and the magnetic field generator is spaced apart from each other, and
wherein, as the magnetic field generator applies a magnetic field to the tactile transmitter, at least a portion of the tactile transmitter moves relative to the magnetic field generator.

17. The tactile actuator of claim 16,
wherein the tactile transmitter includes a matrix layer containing the magnetic particles,
wherein the matrix layer has a tensile strength ranging from 0.02 newtons per square millimeter (N/mm^2) to 8.85 N/mm^2, and
wherein the matrix layer has an elongation percentage ranging from 65% to 700%.

18. The tactile actuator of claim 16,
wherein the elastic member is formed of a polymer having a Young's modulus ranging from 0.5 gigapascals (GPa) to 6.1 GPa.

19. The tactile actuator of claim 16,
wherein at least a portion of the elastic member is in surface contact with the magnetic field generator, and at least a portion of the elastic member is in surface contact with the tactile transmitter.

20. The tactile actuator of claim 16,
wherein the tactile transmitter is a magneto-rheological elastomer.

* * * * *